US011545360B2

(12) United States Patent
Lin et al.

(10) Patent No.: US 11,545,360 B2
(45) Date of Patent: Jan. 3, 2023

(54) SEMICONDUCTOR DEVICE AND MANUFACTURING METHOD OF THE SAME

(71) Applicant: Winbond Electronics Corp., Taichung (TW)

(72) Inventors: Tsung-Wei Lin, Taichung (TW); Kun-Che Wu, Taichung (TW); Chun-Sheng Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 264 days.

(21) Appl. No.: 17/033,695

(22) Filed: Sep. 26, 2020

(65) Prior Publication Data

US 2021/0225639 A1    Jul. 22, 2021

(30) Foreign Application Priority Data

Jan. 22, 2020    (TW) ................................ 109102385

(51) Int. Cl.
    *H01L 21/027*    (2006.01)
(52) U.S. Cl.
    CPC ................................ *H01L 21/0274* (2013.01)
(58) Field of Classification Search
    CPC .................. H01L 21/0274; H01L 21/3086
    See application file for complete search history.

(56) References Cited

U.S. PATENT DOCUMENTS

| 8,227,354 | B2* | 7/2012 | Kim | ................... | H01L 27/11521 |
|-----------|-----|--------|-----|---|---|
| | | | | | 257/E21.219 |
| 2007/0210449 | A1* | 9/2007 | Caspary | .............. | H01L 27/1052 |
| | | | | | 257/734 |
| 2007/0218627 | A1* | 9/2007 | Lattard | ............... | H01L 27/1052 |
| | | | | | 430/394 |
| 2009/0029559 | A1* | 1/2009 | Kang | ........................ | G03F 1/00 |
| | | | | | 438/735 |
| 2009/0239382 | A1* | 9/2009 | Zhu | ...................... | H01L 21/0338 |
| | | | | | 257/E21.026 |

(Continued)

FOREIGN PATENT DOCUMENTS

| CN | 108318976 | 7/2018 |
|----|-----------|--------|
| JP | H0262043  | 3/1990 |

(Continued)

*Primary Examiner* — Yara B Green
*Assistant Examiner* — Fakeha Sehar
(74) *Attorney, Agent, or Firm* — JCIPRNET

(57) ABSTRACT

A manufacturing method of a semiconductor device includes forming a hard mask layer and a photoresist on a substrate having a layer to be etched, and performing exposure and development such that the patterned photoresist has first trenches and to expose the hard mask layer, wherein ends of the first trenches have a width gradually decreased toward an end point. The exposed hard mask layer is removed using the patterned photoresist to transfer the pattern of the first trenches to the hard mask layer such that the patterned hard mask layer has second trenches, and the ends of the second trenches have a width gradually decreased toward an end point. Spacers are formed on inner walls of the second trenches. The hard mask layer is removed such that the layer to be etched is exposed. The exposed layer to be etched is removed using the spacers as an etch mask.

9 Claims, 11 Drawing Sheets

(56) References Cited

U.S. PATENT DOCUMENTS

| | | | | |
|---|---|---|---|---|
| 2009/0311634 A1* | 12/2009 | Yue | ............... | H01L 21/0338 430/323 |
| 2012/0168955 A1* | 7/2012 | Chen | ............... | H01L 21/0337 438/669 |
| 2013/0049211 A1* | 2/2013 | Eom | ............... | H01L 21/0338 257/773 |
| 2013/0056884 A1* | 3/2013 | Eom | ............... | H01L 21/32139 257/782 |
| 2013/0161839 A1* | 6/2013 | Han | ............... | H01L 21/308 257/E21.257 |
| 2013/0270716 A1* | 10/2013 | Kim | ............... | H01L 23/528 438/666 |
| 2015/0270138 A1* | 9/2015 | Cho | ............... | H01L 21/0337 438/701 |
| 2020/0004137 A1* | 1/2020 | Liu | ............... | G03F 7/2004 |

FOREIGN PATENT DOCUMENTS

| | | | |
|---|---|---|---|
| KR | 20090110172 A | * | 10/2009 |
| KR | 20100019798 A | * | 2/2010 |
| TW | 201636736 A | * | 10/2016 |

* cited by examiner

SEMICONDUCTOR DEVICE AND MANUFACTURING METHOD OF THE SAME

CROSS-REFERENCE TO RELATED APPLICATION

This application claims the priority benefit of Taiwan application serial no. 109102385, filed on Jan. 22, 2020. The entirety of the above-mentioned patent application is hereby incorporated by reference herein and made a part of this specification.

BACKGROUND OF THE INVENTION

Field of the Invention

The invention relates to a semiconductor technique, and more particularly, to a semiconductor device capable of improving line end margin and a manufacturing method of the same.

Description of Related Art

Under the miniaturization of the new generation semiconductor process, the formation of lines in the cell area depends on more advanced process techniques. Currently, self-alignment double patterning (SADP) has been developed to overcome the limitation of light source resolution in the lithography process to achieve the design of device miniaturization. However, the line ends formed by the SADP process are prone to broken patterns and may not be sealed. Such a situation is prone to occur at the position where the active region is defined, thus causing the device operation to fail.

SUMMARY OF THE INVENTION

The invention provides a manufacturing method of a semiconductor device capable of improving line end margin to avoid the situation in which broken patterns occur at line ends that may not be sealed.

The invention also provides a semiconductor device having a wider and thick line ends.

The manufacturing method of a semiconductor device of the invention includes first forming a layer to be etched on a substrate, and then forming at least one hard mask layer. Then, a photoresist is formed on the hard mask layer, and exposure and development are performed using a photomask such that the patterned photoresist has a plurality of first trenches and to expose the hard mask layer, wherein an end of each of the first trenches has a width gradually decreased toward an end point. The photomask includes a plurality of main patterns arranged in parallel with each other and a plurality of auxiliary patterns spaced a distance from an end of each of the main patterns to reduce a width of the photomask at the distance, wherein the distance is 1.5 times to 2.5 times a first width of each of the main patterns. By using the patterned photoresist as an etch mask, the exposed hard mask layer is removed to transfer a pattern of the first trenches to the hard mask layer such that the patterned hard mask layer has a plurality of second trenches, and an end of each of the second trenches also has a width gradually decreased toward an end point. Spacers are then formed on inner walls of the second trenches, and the hard mask layer is removed such that the layer to be etched is exposed. The exposed layer to be etched is removed using the spacers as an etch mask.

In an embodiment of the invention, a second width of the auxiliary patterns is 0.4 times to 0.6 times the first width of each of the main patterns.

In an embodiment of the invention, the photoresist is a positive photoresist.

The manufacturing method of another semiconductor device of the invention includes first forming a layer to be etched on a substrate, and then forming at least one hard mask layer. Then, a photoresist is formed on the hard mask layer, and exposure and development are performed using a photomask such that the patterned photoresist has a plurality of first trenches and to expose the hard mask layer, wherein an end of each of the first trenches has a width gradually decreased toward an end point. The photomask includes a plurality of first main patterns arranged in parallel with each other in a first direction, a second main pattern connected to an end of the first main patterns, and a plurality of auxiliary patterns spaced a distance from the end of each of the first main patterns to increase a width of the first main patterns at the distance, wherein the distance is 1.5 times to 2.5 times a first width of each of the first main patterns. By using the patterned photoresist as an etch mask, the exposed hard mask layer is removed to transfer a pattern of the first trenches to the hard mask layer such that the patterned hard mask layer has a plurality of second trenches, and an end of each of the second trenches also has a width gradually decreased toward an end point. Spacers are then formed on inner walls of the second trenches, and the hard mask layer is removed such that the layer to be etched is exposed. The exposed layer to be etched is removed using the spacers as an etch mask.

In another embodiment of the invention, a third width of the auxiliary patterns is 1.4 times to 1.6 times the first width of each of the first main patterns.

In another embodiment of the invention, the photoresist is a positive photoresist.

The semiconductor device of the invention is formed by the manufacturing method, wherein the semiconductor device includes spacers, and the spacers include a plurality of lines and a tip portion located at an end of every two of the lines, wherein the tip portion has a width gradually decreased toward an end point, and a height of the tip portion is substantially equal to a height of each of the lines.

In still another embodiment of the invention, a length of the tip portion is greater than 1.8 times the width.

In still another embodiment of the invention, a length of the tip portion is less than 2.4 times the width.

In still another embodiment of the invention, the plurality of lines have substantially a same width.

Based on the above, in the invention, exposure and development are performed using a photomask having specific auxiliary patterns such that trenches having a sharpened end are formed in the photoresist (and the hard mask layer). Therefore, spacer height on the inside of the trench end may be increased by such a shape to solve the line end broken issue.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
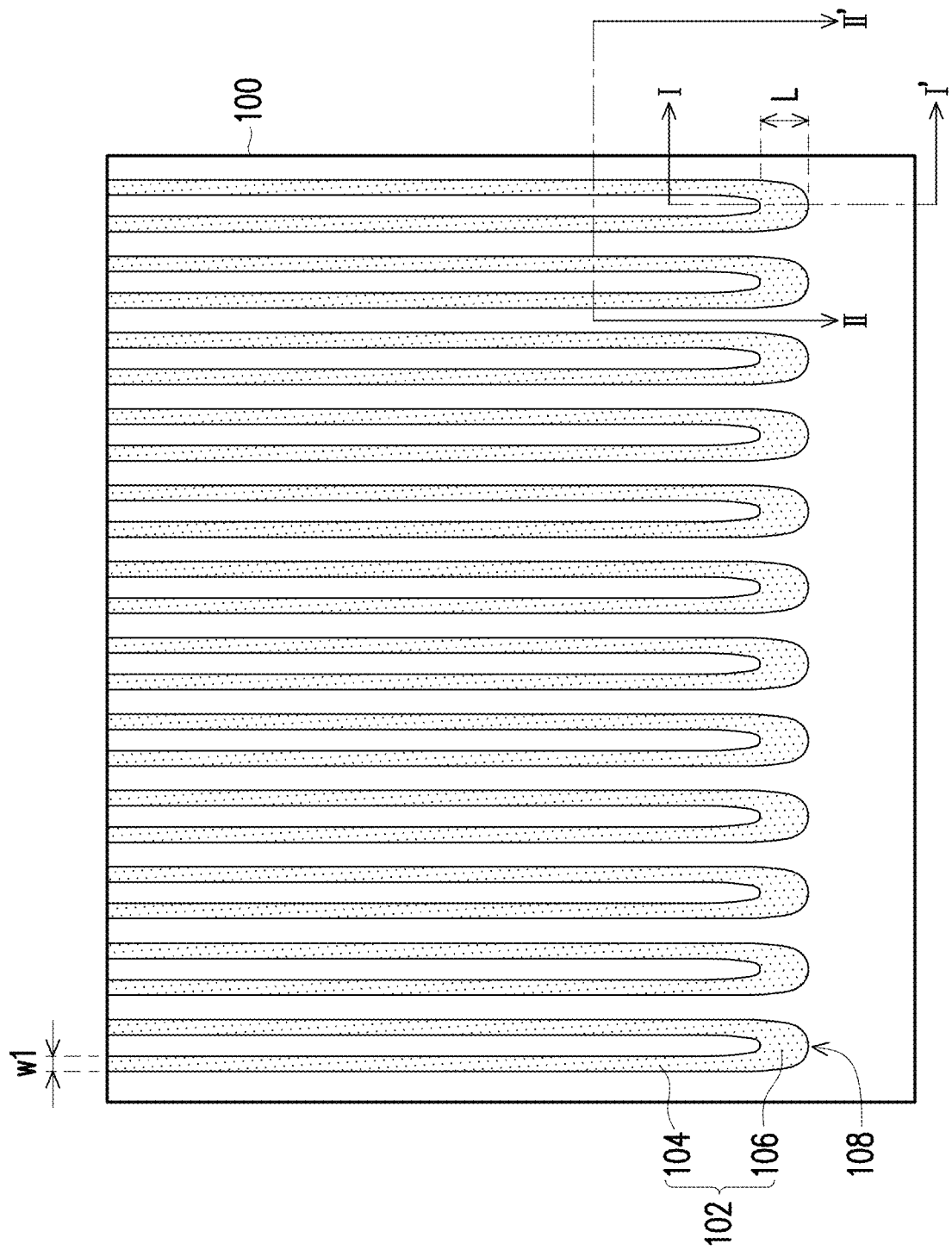
FIG. 1 is a top view of a semiconductor device according to an embodiment of the invention.

FIG. 1 is a top view of a semiconductor device according to an embodiment of the invention.

Referring to FIG. 1, the semiconductor device of the present embodiment includes spacers 102 located on a substrate 100, and the spacers 102 include a plurality of lines 104 and a tip portion 106 located at an end of every two of the lines 104. The tip portion 106 has a width gradually decreased toward an end point 108, and the lines 104 have, for example, a substantially same width w1. In an embodiment, a length L of the tip portion 106 is greater than 1.8 times the width w1 and less than 2.4 times the width w1. The manufacturing method of the spacers 102 in FIG. 1 and the process of defining (such as an active region) using the spacers 102 are described in detail below.

FIG. 2A to FIG. 2I are cross-sectional views of a manufacturing process of the semiconductor device of FIG. 1, wherein the left half of each figure is a cross section of the I-I' section of FIG. 1 and the right half of each figure is a cross section of the II-II' section of FIG. 1. That is, the left half of each figure is a cross section along the length direction (first direction), and the right half is a cross section along the width direction (second direction).

Figure 2A:
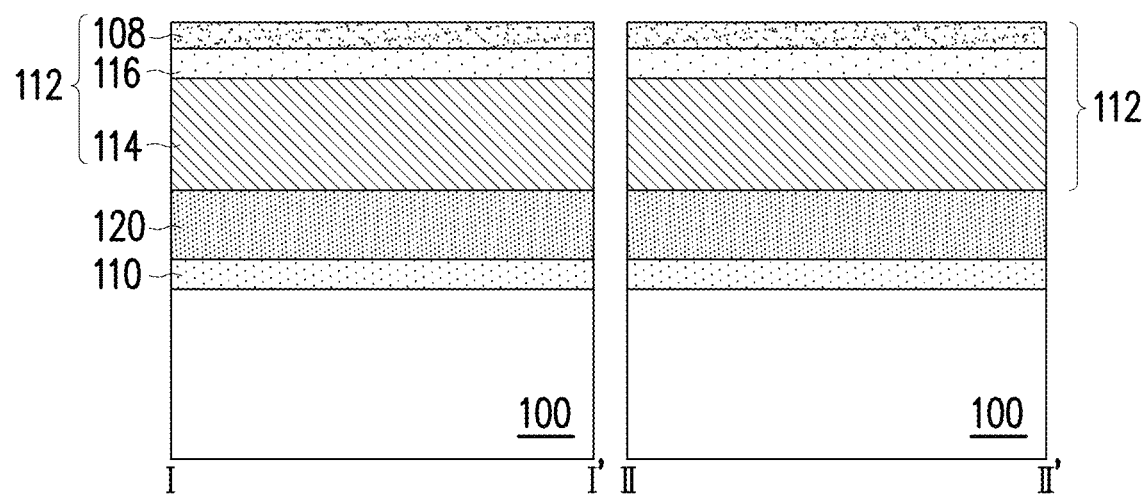
FIG. 2A to FIG. 2I are cross-sectional views of a manufacturing process of a semiconductor device according to an embodiment of the invention.

Please refer to FIG. 2A. First, a layer 110 to be etched is formed on the substrate 100, and then at least one hard mask layer 112 is formed. The hard mask layer 112 may be formed by stacking different material layers according to the etch rate of different materials (that is, etch selectivity). For example, if an active region (not shown) is to be defined in the substrate 100, a deep trench isolation structure (not shown) needs to be formed in the substrate 100. Therefore, in order to accurately form a trench having a predetermined depth, a thicker hard mask layer 112 is needed, such as a hard mask layer 112 formed by a carbon layer 114, a silicon oxynitride layer 116, and an anti-reflection layer 118, and an intermediate layer 120 may be formed on the layer 110 to be etched before the hard mask layer 112 is formed. The intermediate layer 120 may be used as an etch stop layer in a subsequent process. However, the invention is not limited thereto. In another embodiment, if not used to form a deep trench, the hard mask layer 112 may also be a single material layer, and the intermediate layer 120 is omitted.

Figure 2B:

Then, referring to FIG. 2B, a photoresist 122 is formed on the hard mask layer 112, and exposure and development are performed using a photomask 124. In the present embodiment, the pattern of the photomask 124 and the type of the matching photoresist 122 are as follows.

Figure 3A:
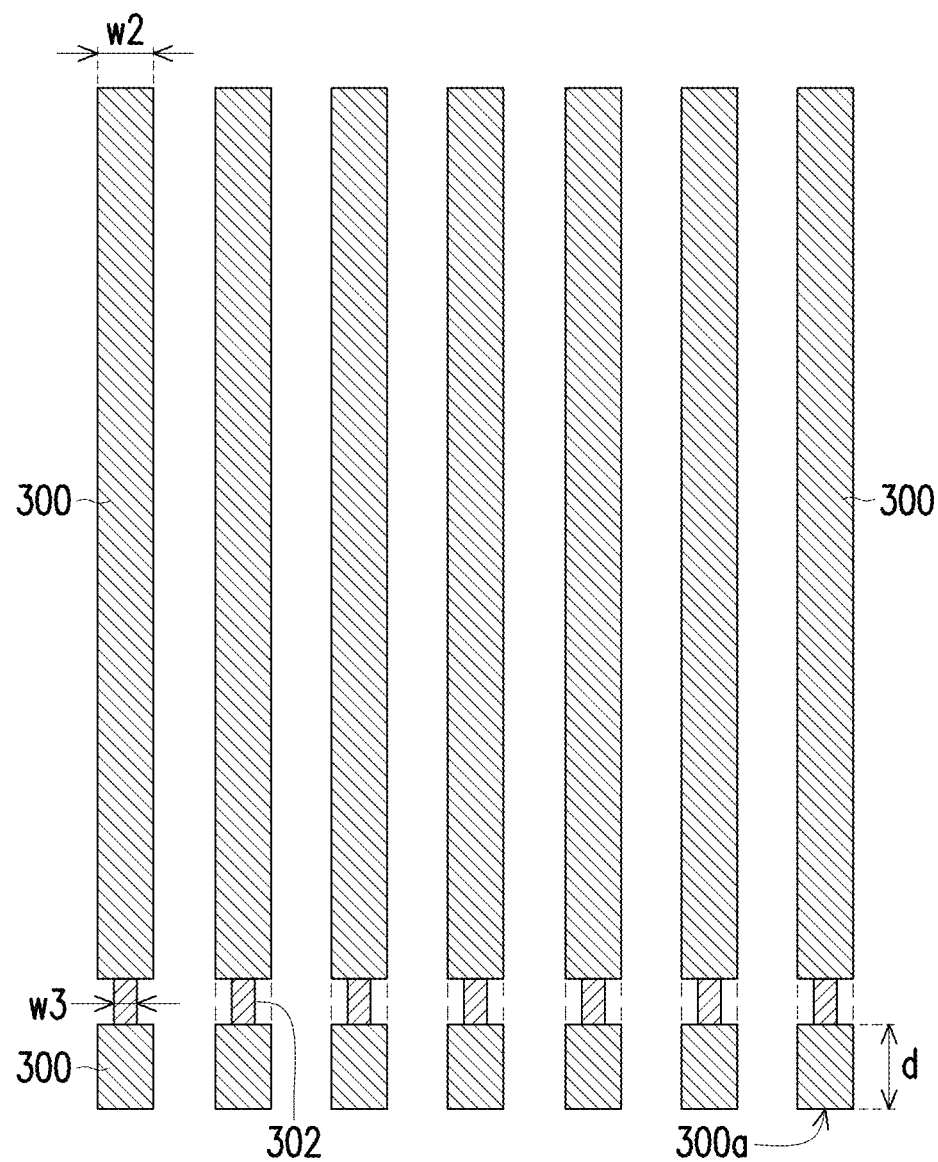
FIG. 3A is a diagram of a photomask pattern used in the step of FIG. 2B.

FIG. 3A is a diagram of a photomask pattern of the photomask 124, and the photomask may be used with a positive photoresist. The photomask of FIG. 3A includes a plurality of main patterns 300 arranged in parallel with each other and a plurality of auxiliary patterns 302 spaced a distance d from an end 300a of each of the main patterns 300 to reduce the width of the photomask at the distance d, wherein the distance d is, for example, 1.5 times to 2.5 times a first width w2 of each of the main patterns 300. A second width w3 of the auxiliary patterns 302 is, for example, 0.4 times to 0.6 times the first width w2 of each of the main patterns 300. Due to the optical effect in the exposure process, the developed photoresist 122 has a plurality of first trenches 304, as shown in the top view in FIG. 3C, wherein an end 304a of each of the first trenches 304 has a gradually decreased width toward an end point 306.

Figure 3B:
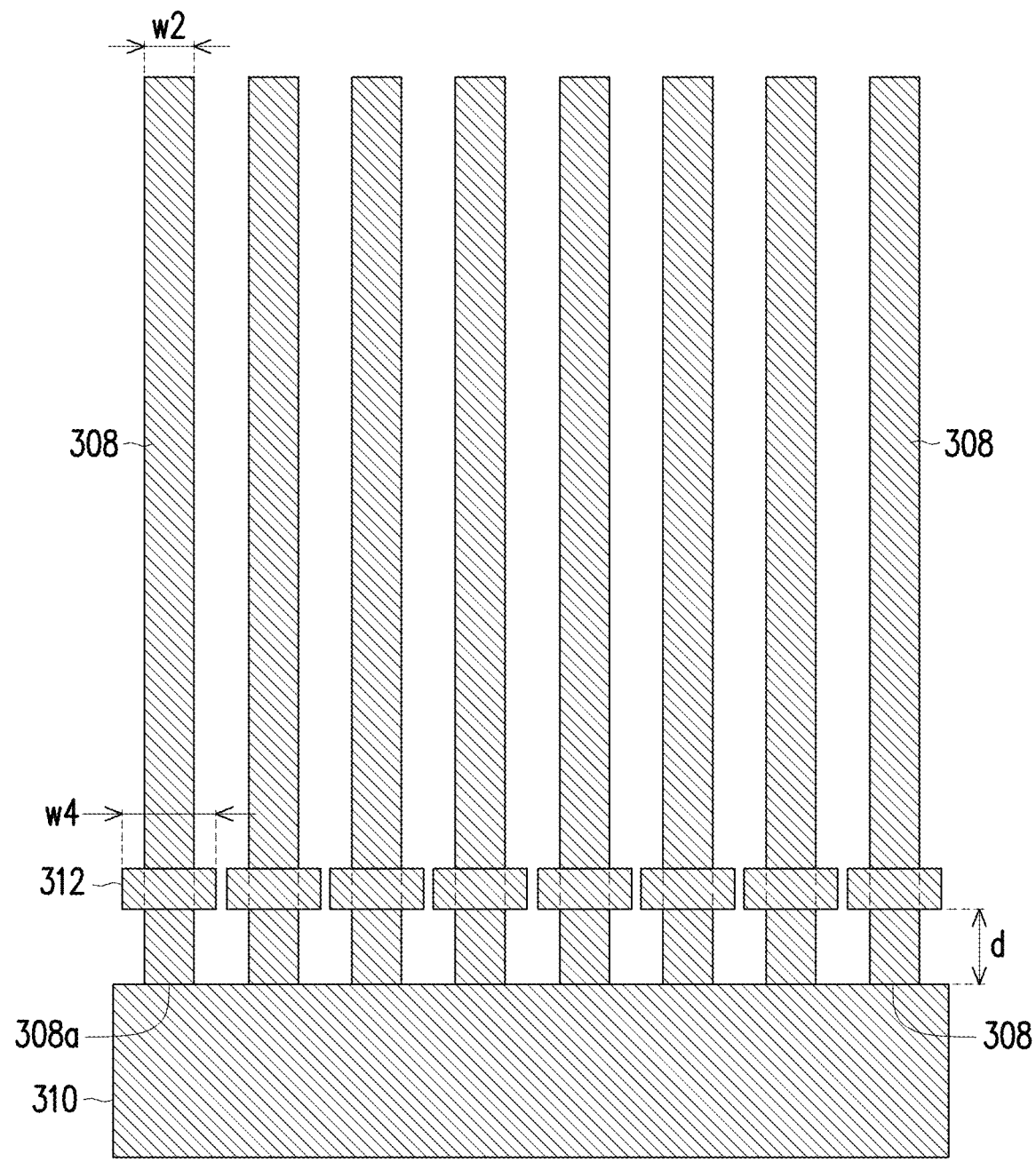
FIG. 3B is a diagram of another photomask pattern used in the step of FIG. 2B.

FIG. 3B is a diagram of another photomask pattern of the photomask 124, and the photomask may be used with a positive photoresist. The photomask of FIG. 3B includes a plurality of first main patterns 308 arranged in parallel with each other in a first direction, a second main pattern 310 connected to an end 308a of the plurality of first main patterns 308, and a plurality of auxiliary patterns 312 spaced at the distance d from the end 308a of each of the first main patterns 308 to increase the width of the first main patterns 308 at the distance d, wherein the distance d is 1.5 times to 2.5 times the first width w2 of each of the first main patterns 308. A third width w4 of the auxiliary patterns 312 is 1.4 times to 1.6 times the first width w2 of each of the first main patterns 310. Due to the optical effect in the exposure process, the photoresist after development is shown in FIG. 3C and is not repeated herein.

Figure 2C:
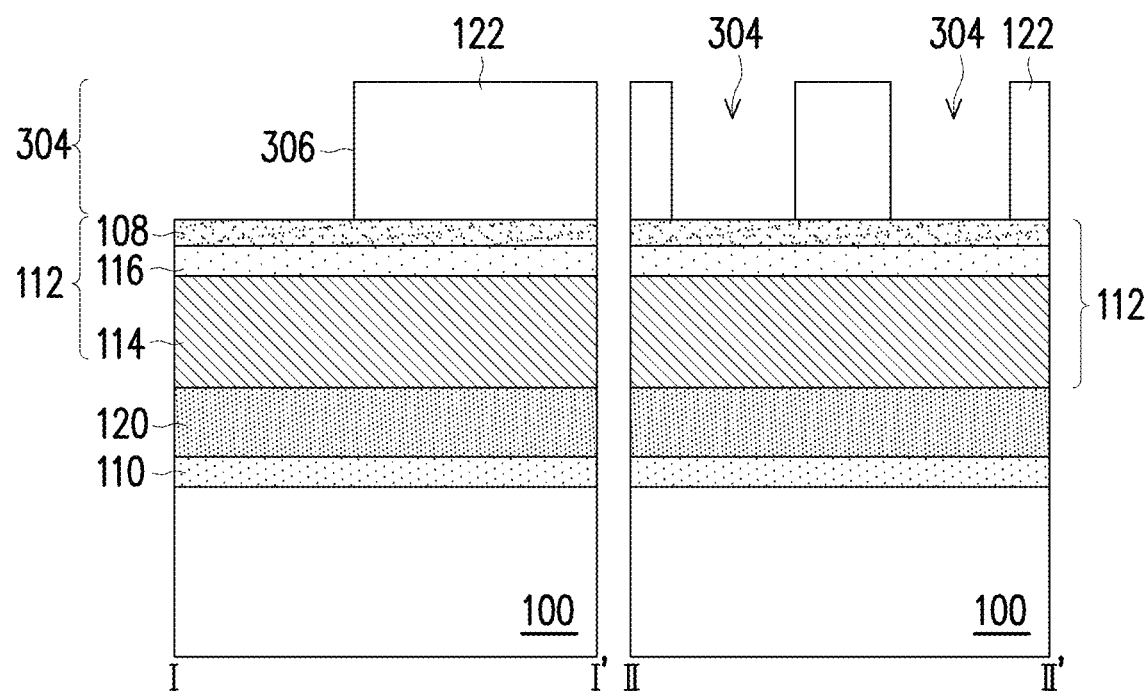

Next, referring to FIG. 2C, the exposed hard mask layer 112 is removed using the patterned photoresist 122 as an etch mask.

Figure 2D:
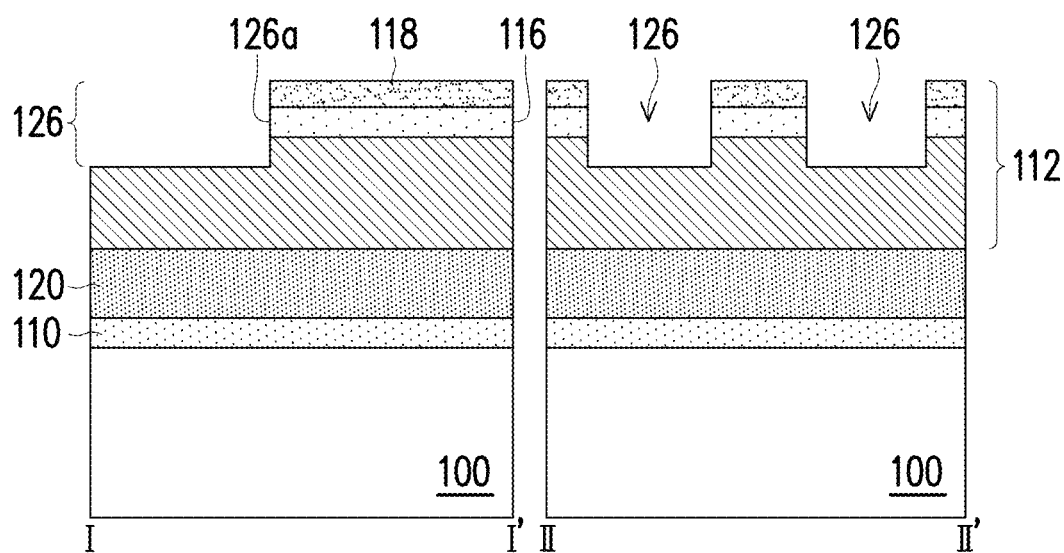
Figure 3C:
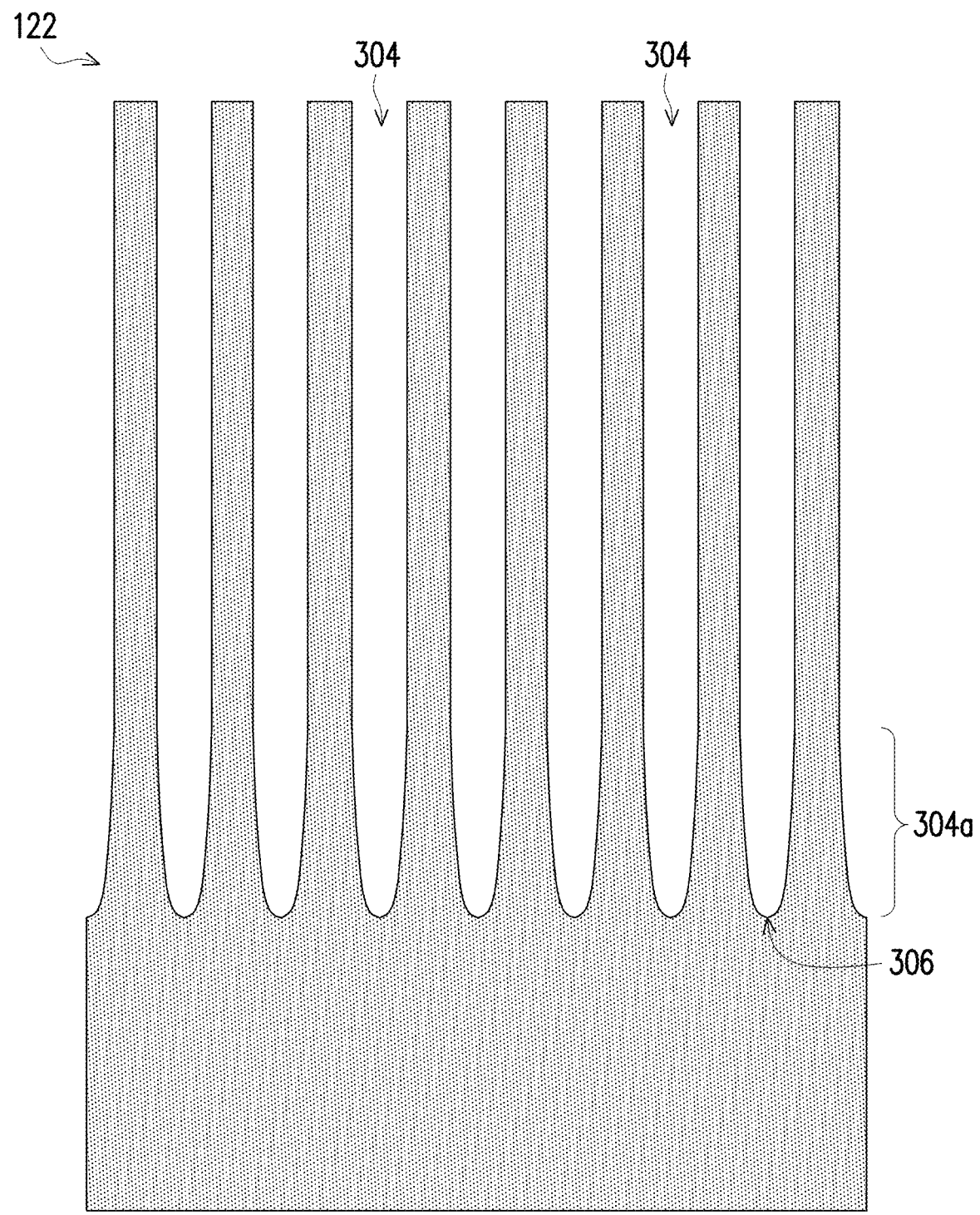
FIG. 3C is a top view of a photoresist after exposure and development using the photomask of FIG. 3B.

Then, referring to FIG. 2D, the pattern of the first trenches (304 in FIG. 2C) is transferred to the hard mask layer 112 such that the patterned hard mask layer 112 also has a plurality of second trenches 126, and the end of each of the second trenches 126 also has a width gradually decreased toward an end point 126a, and the top view thereof is similar to FIG. 3C.

Figure 2E:
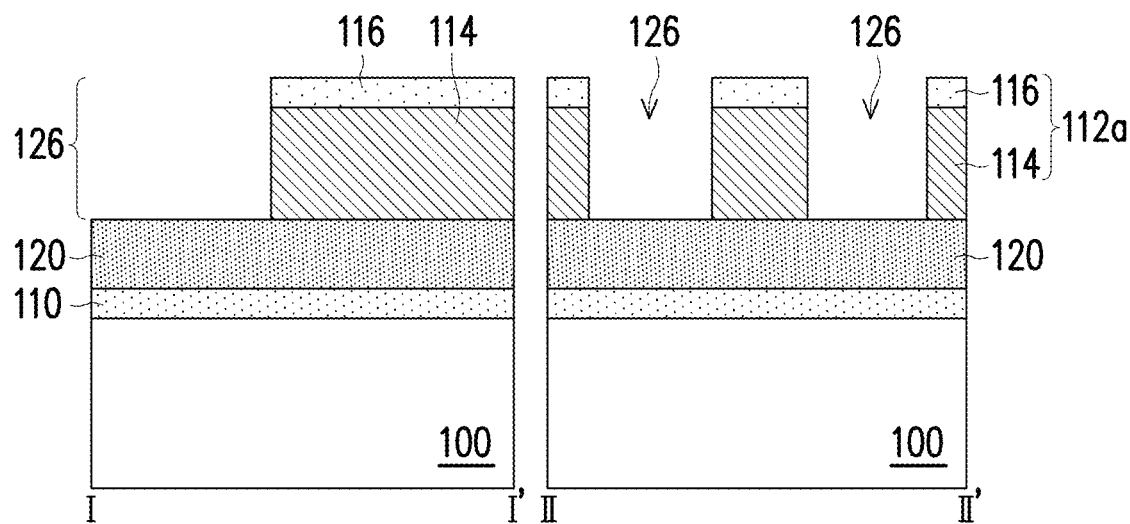
Figure 4:
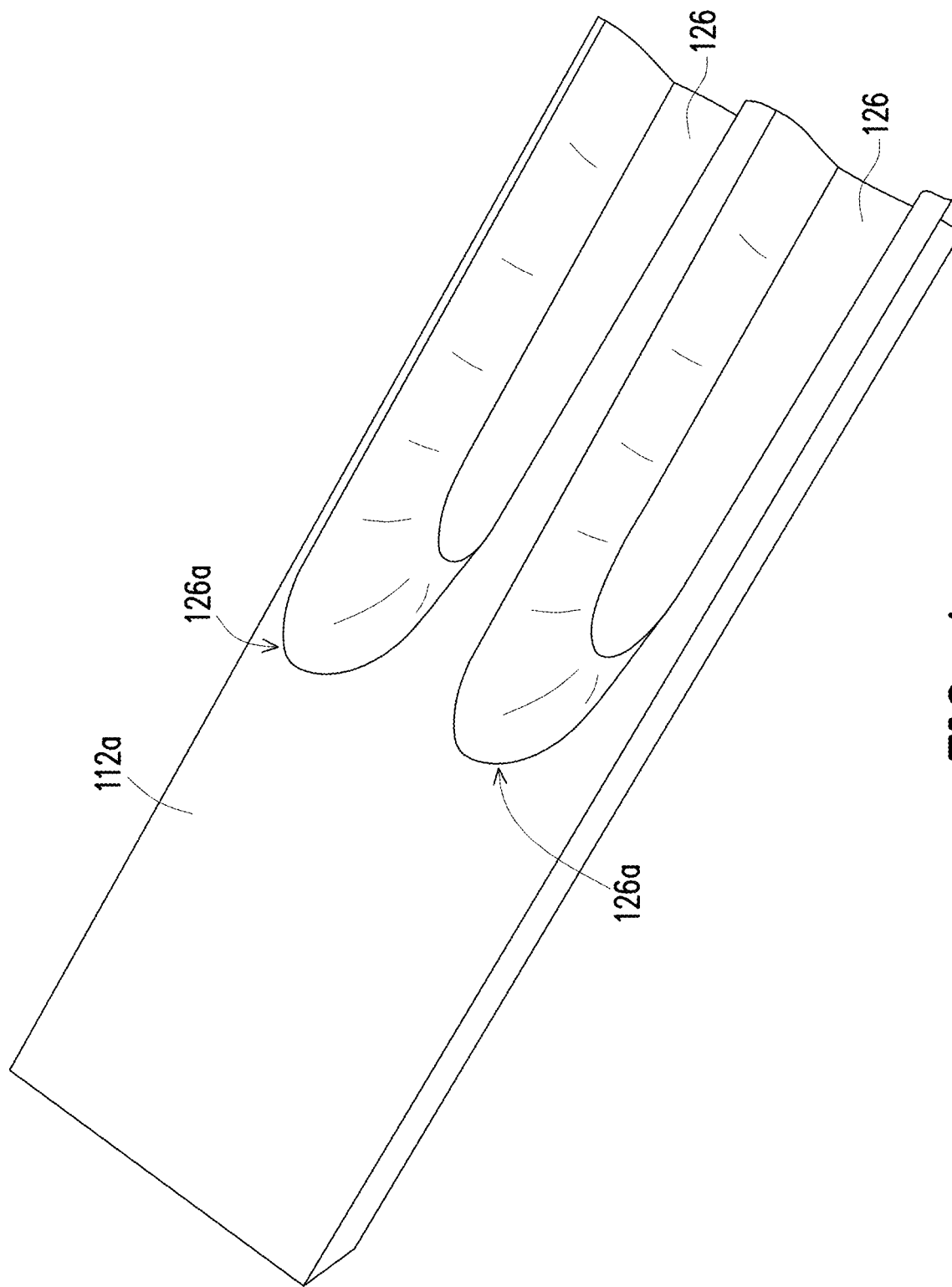
FIG. 4 is a 3D view of a hard mask layer formed in the step of FIG. 2E.

Next, please refer to FIG. 2E. Since a hard mask layer 112a itself is thicker, the photoresist (122 in FIG. 2C) may be consumed before the exposed hard mask layer 112a is completely removed. Therefore, the patterning of the hard mask layer 112a may be completed in a subsequent etching via the etch rate of different materials. For example, the exposed carbon layer 114 is removed using the silicon oxynitride layer 116 as an etch mask until the intermediate layer 120 is exposed. A 3D view of the mask layer 112a formed by this step is shown in FIG. 4.

Figure 2F:
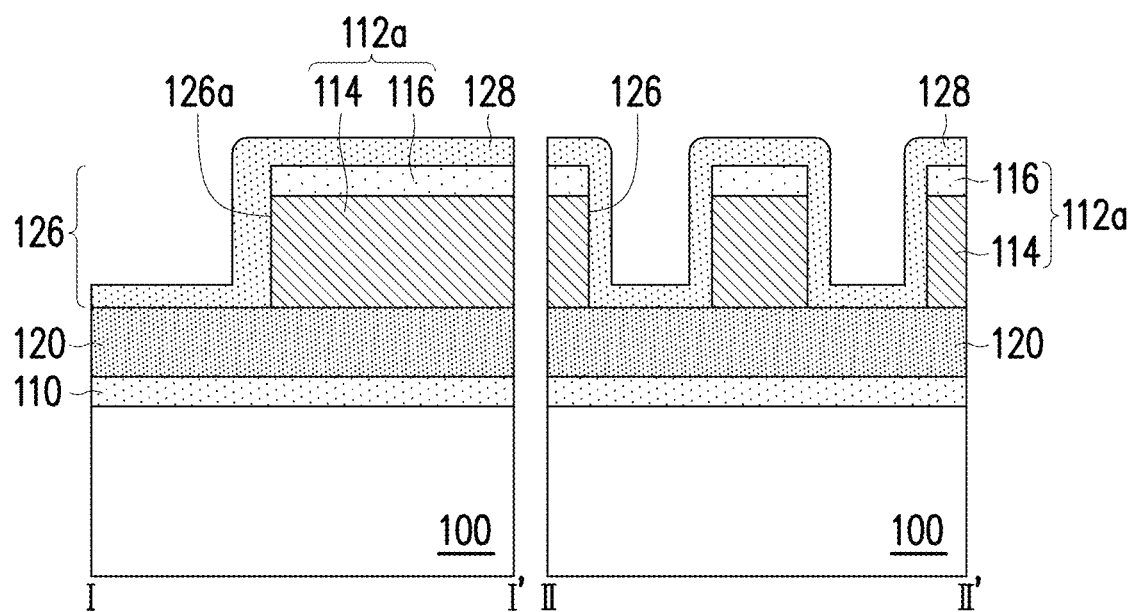

Then, referring to FIG. 2F, in order to form spacers on the inner walls of the second trenches 126, a material layer 128 may be first formed on the substrate 100 to cover the patterned hard mask layer 112a, the inner walls of the second trenches 126, and the surface of the intermediate layer 120. In addition, since the end of the second trenches 126 has a width gradually decreased toward the end point 126a, a thicker material layer 128 is deposited at the end point 126a.

Figure 2G:
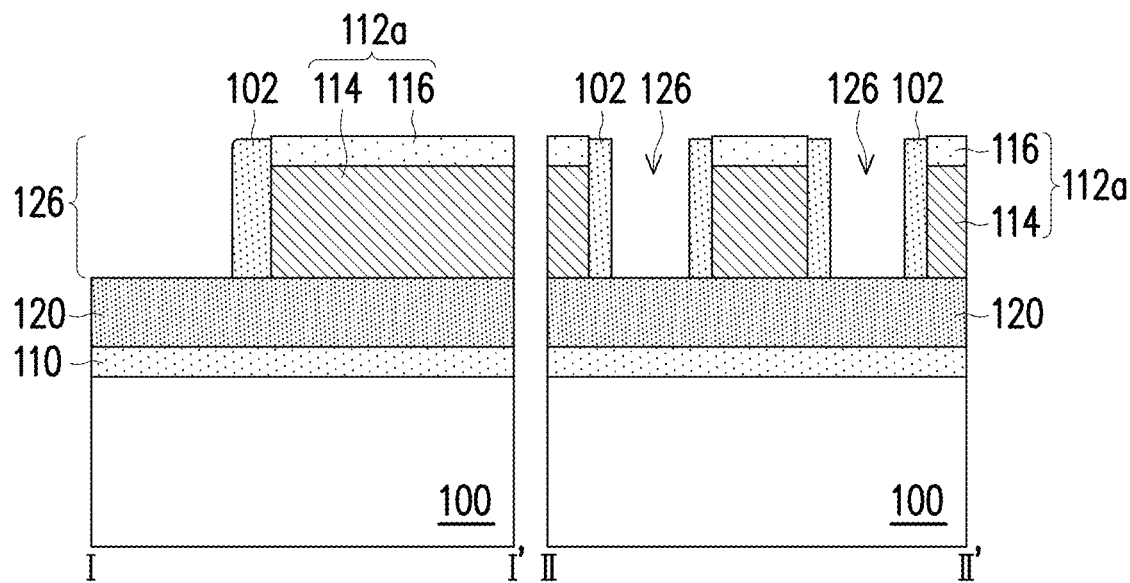

Next, referring to FIG. 2G, the material layer is etched back, and the spacers 102 are formed on the inner walls of the second trenches 126, and the intermediate layer 120 is exposed.

Figure 2H:
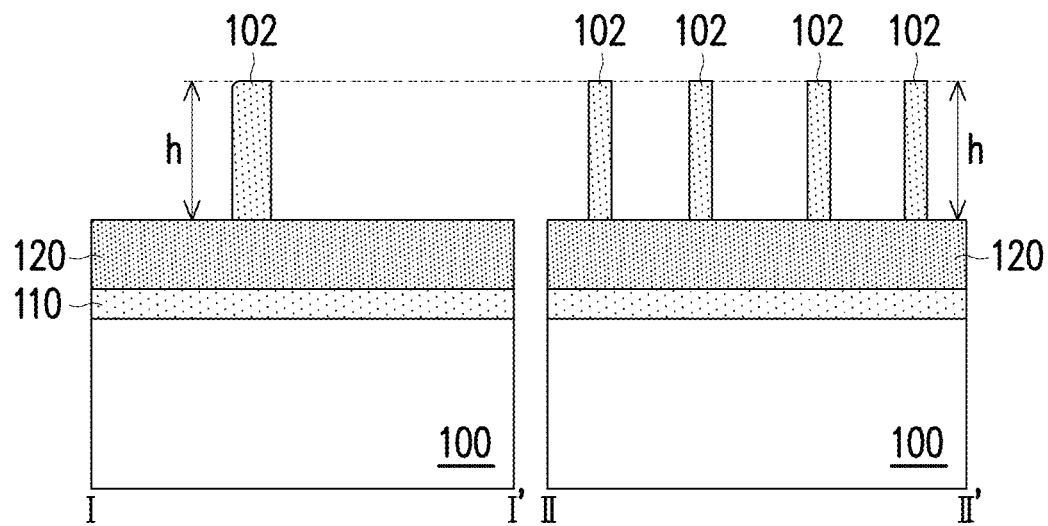

Then, referring to FIG. 2H, the hard mask layer 112a of FIG. 2G is removed such that a height h of the remaining spacers 102 is the same in both the length direction and the width direction. Therefore, comparing the tip portion 106 of FIG. 1 and the lines 104, the height of the spacers 102 at the two portions is substantially the same. As a result, the line end (i.e., the tip portion 106) margin of a subsequent etching process may be ensured.

Figure 2I:
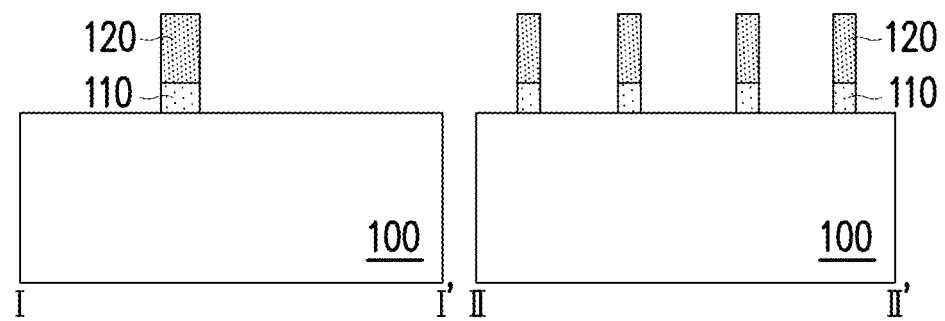

Next, referring to FIG. 2I, the exposed intermediate layer 120 may be removed first by using the spacers 102 in FIG. 2H as an etch mask. Next, the exposed layer 110 to be etched is removed using the intermediate layer 120 as an etch mask. However, the invention is not limited thereto. In another embodiment, if there is no intermediate layer 120 and a hard mask layer is directly formed on the layer 110 to be etched, then the layer to be etched 110 may be removed by directly using the spacers 102 as an etch mask.

A number of experimental examples is described below to verify the efficacy of the disclosure. However, the disclosure is not limited to the following content. Without exceeding the scope of the invention, the pattern linewidth and ratio of the photomask may be suitably changed. Accordingly, restrictive interpretation should not be made to the invention based on the experiments described below.

Experimental Example 1

Figure 5:
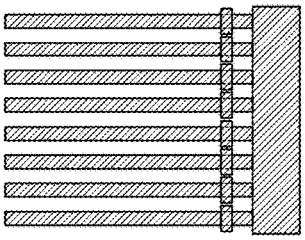
FIG. 5 is a scanning electron microscope (SEM) image of a comparative example and experimental examples at each stage of a manufacturing process.

According to the manufacturing process of FIG. 2A to FIG. 2H, the spacers were manufactured, and then an SEM image was taken and shown in FIG. 5, wherein the photomask used during exposure and development is shown in FIG. 3B, and the first width w2 of the first main patterns arranged in parallel with each other in the photomask was 50 nm, the third width w4 of the second main pattern connected to the end of the plurality of first main patterns was 76 nm, and the distance d between the auxiliary patterns and the end of the first main patterns was 100 nm, and therefore d was 2 times w2, and w4 was 1.52 times w2. It should be noted that the size of the photomask used in the experiments of the invention was twice the layout size, but the photomask was actually enlarged by four times.

Next, the step of FIG. 2I was performed with the obtained spacers, and the obtained structure was photographed by SEM and shown in FIG. 5.

Experimental Example 2

Using the same manufacturing process as Experimental example 1, the difference was only that the third width w4 of the second main pattern in the photomask used was changed to 80 nm, and therefore w4 was 1.6 times w2. SEM images of the structures at different stages were then taken and shown in FIG. 5.

Comparative Example

Using the same manufacturing process as Experimental example 1, the only difference was that the photomask used had only the main patterns (300 in FIG. 3A), wherein the first width w2 of the main patterns arranged in parallel with each other was 50 nm. SEM images of the structures at different stages were then taken and shown in FIG. 5.

It may be seen from FIG. 5 that an SADP process was performed using the general photomask of the Comparative example. Although the formed spacers did not have broken patterns at the line end, subsequent etching with such spacers resulted in significant broken patterns at the line end in the structure of the next layer thereof (such as the layer 110 to be etched in FIG. 2I). In contrast, in Experimental examples 1 to 2 of the invention, the spacers and the structural layer subsequently etched both did not have the issue of broken patterns at the line end.

Based on the above, in the invention, the photomask used for exposing the photoresist is a photomask having specific auxiliary patterns such that trenches sharpened at the end are formed in the photoresist (and the hard mask layer) after development. That is, the width of the trenches is gradually decreased toward the end point such that the thickness of the material layer deposited at the end of the trenches may be increased by the shape of the hard mask layer, and after the material layer is etched back to form the spacers, the height of the resulting spacers also approaches the line portion and may even be greater than the line portion, thus ensuring the line end margin of a subsequent etching process.

What is claimed is:

1. A manufacturing method of a semiconductor device, comprising:
    forming a layer to be etched on a substrate;
    forming at least one hard mask layer on the layer to be etched;
    forming a photoresist on the at least one hard mask layer;
    performing exposure and development using a photomask such that the patterned photoresist has a plurality of first trenches and to expose the at least one hard mask layer, and an end of each of the first trenches has a width gradually decreased toward an end point, wherein the photomask comprises a plurality of first main patterns arranged in parallel with each other, a second main pattern connected to an end of the plurality of first main patterns, and a plurality of auxiliary patterns spaced a distance from the end of each of the first main patterns to increase a width of the first main patterns at the distance, and the distance is 1.5 times to 2.5 times a first width of each of the first main patterns;
    removing the exposed at least one hard mask layer using the patterned photoresist as an etch mask such that a pattern of the plurality of first trenches is transferred to the at least one hard mask layer such that the patterned at least one hard mask layer has a plurality of second trenches, and an end of each of the second trenches has a width gradually decreased toward an end point;
    forming spacers on inner walls of the plurality of second trenches;
    removing the patterned at least one hard mask layer and exposing the layer to be etched; and
    removing the exposed layer to be etched using the spacers as an etch mask.

2. The manufacturing method of the semiconductor device of claim 1, wherein a third width of the auxiliary patterns is 1.4 times to 1.6 times the first width of each of the first main patterns.

3. The manufacturing method of the semiconductor device of claim 2, wherein the photoresist is a positive photoresist.

4. The manufacturing method of the semiconductor device of claim 1, wherein the at least one hard mask layer is formed by stacking different material layers.

5. The manufacturing method of the semiconductor device of claim 1, wherein the at least one hard mask layer is a single material layer.

6. The manufacturing method of the semiconductor device of claim 1, wherein a step of forming the at least one hard mask layer on the layer to be etched comprises sequentially forming a carbon layer, a silicon oxynitride layer, and an anti-reflection layer on the layer to be etched.

7. The manufacturing method of the semiconductor device of claim 1, wherein before a step of Ruining the at least one hard mask layer on the layer to be etched, further comprises forming an intermediate layer on the layer to be etched as an etch stop layer.

8. The manufacturing method of the semiconductor device of claim 1, wherein the spacers comprise a plurality of lines and a tip portion located at an end of every two of the plurality of lines, wherein the tip portion has a width gradually decreased toward an end point.

9. The manufacturing method of the semiconductor device of claim 8, wherein a height of the tip portion is substantially equal to a height of each of the plurality of lines.

\* \* \* \* \*